United States Patent
Vega-Irizarry

(10) Patent No.: US 12,051,215 B1
(45) Date of Patent: Jul. 30, 2024

(54) BITSTREAM FILTER

(71) Applicant: GOVERNMENT OF THE UNITED STATES AS REPRESENTED BY THE SECRETARY OF THE AIR FORCE, Rome, NY (US)

(72) Inventor: Alfredo Vega-Irizarry, Rome, NY (US)

(73) Assignee: United States of America as represented by the Secretary of the Air Force, Rome, NY (US)

( * ) Notice: Subject to any disclaimer, the term of this patent is extended or adjusted under 35 U.S.C. 154(b) by 0 days.

(21) Appl. No.: 16/365,741

(22) Filed: Mar. 27, 2019

Related U.S. Application Data

(60) Provisional application No. 62/661,670, filed on Apr. 24, 2018.

(51) Int. Cl.
```
G06T 7/32      (2017.01)
H03M 7/12      (2006.01)
H03M 7/30      (2006.01)
H04N 19/126    (2014.01)
```

(52) U.S. Cl.
CPC ............... *G06T 7/32* (2017.01); *H03M 7/12* (2013.01); *H03M 7/3086* (2013.01); *H04N 19/126* (2014.11); *G06T 2207/20182* (2013.01); *G06T 2207/20221* (2013.01)

(58) Field of Classification Search
CPC ............ G06T 7/73; G06T 7/11; H04W 12/06; H04W 4/029
See application file for complete search history.

(56) References Cited

U.S. PATENT DOCUMENTS

| | | | |
|---|---|---|---|
| 2004/0136687 A1* | 7/2004 | Ju | H04N 9/8042 386/232 |
| 2010/0135384 A1* | 6/2010 | Berkvens | H04N 19/60 375/240.2 |
| 2013/0322461 A1* | 12/2013 | Poulsen | H04L 12/40169 370/458 |
| 2014/0079158 A1* | 3/2014 | Wollesen | H04B 1/0007 375/316 |

OTHER PUBLICATIONS

X. Hei et al. "Feature Extraction Optimization for Bitstream Communication Protocol Format Reverse Analysis," 2019 18th IEEE International Conference on Trust, Security and Privacy in Computing and Communications/13th IEEE International Conference on Big Data Science and Engineering, 2019, pp. 662-669 (Year: 2019).*

* cited by examiner

*Primary Examiner* — Ross Varndell
(74) *Attorney, Agent, or Firm* — AFRL/RI; Randall P. Jones

(57) ABSTRACT

A method of detecting starting positions, sizes, and number of records of fields within a bit stream, by formatting the bit stream into a frame using positive logic, then performing decimal conversion of different predetermined field lengths on the framed bit stream, to produce channels. Noise is either removed or amplified from the framed bit stream, and the frame and the channels are input to an image detection module to identify fields within the framed bit stream.

12 Claims, 10 Drawing Sheets

800

900

| BINARY TWO's COMPLEMENT | | | | | | | DECIMAL | | | | | | |
|---|---|---|---|---|---|---|---|---|---|---|---|---|---|
| 0 | 1 | 1 | 1 | 1 | 1 | 0 | 3 | -1 | -1 | -4 | -2 | 0 | 0 |
| 1 | 0 | 1 | 1 | 1 | 0 | 1 | -3 | 3 | -2 | -1 | 3 | -3 | 2 |
| 1 | 1 | 1 | 1 | 0 | 0 | 1 | -1 | -1 | -3 | -3 | 1 | 2 | 2 |
| 0 | 0 | 1 | 0 | 1 | 1 | 0 | 1 | 2 | -3 | 2 | -3 | 2 | 0 |
| 0 | 1 | 1 | 0 | 0 | 0 | 1 | 3 | -2 | -4 | 0 | -3 | 1 | -2 |

Fig. 10

BITSTREAM FILTER

RELATED APPLICATIONS

This application claims all rights and priority on prior pending United States provisional patent applications Ser. No. 62/661,670 filed 2018 Apr. 24, the entirety of the disclosure of which is incorporated herein by reference.

GOVERNMENT RIGHTS STATEMENT

The invention described herein may be manufactured and used by or for the Government of the United States for all governmental purposes without the payment of any royalty.

FIELD OF THE INVENTION

This invention relates to the field of telecommunications. More particularly, this invention relates to decoding communications having an unknown data format.

BACKGROUND OF THE INVENTION

Many systems produce serial, single-channel streams of binary data, which are generally referred to as bit streams. A common practice in telecommunications is to send binary data in frames of repeated patterns. An example of such encoding structures is found in Time Division Multiplexing (TDM). Periodically transmitted data frames form a primitive database of binary information, where given positions in a frame constitute fields and successive frames represent data records. The complete collection of frames and records is referred to as a framed bit stream.

For example, sensors can digitize coordinates of moving targets that can be encoded in fields that represent x, y, and z coordinates with a time stamp. This information may be transmitted in a frame of data. Each update of position information is sent as a record (frame), where each record includes fields of specific information, such as the coordinates and the time. This transmitted information is captured by a receiver.

For a receiving system that understands the characteristics of the bit stream, such as the number of fields in a record, the numbers of digits in each of those fields, the formats of the numbers in those fields, and what the numbers in the fields represent, it is a simple task to decode the bit stream and use the data in a meaningful manner. Further, with a foreknowledge of these characteristics, confounding influences such as noise can be separated from the data and disregarded.

However, for an unintended receiving system that does not already know the characteristics of the bit stream, such as in the case of a third-party system that surreptitiously intercepts the bit stream, decoding the bit stream is a daunting task. Not knowing the field types and sizes, the encoding, and the presence of irrelevant data such as noise would require the knowledge and skills of a signal analyst for detecting the location and the types of fields. In addition to the interpretation of the data, a signal analyst may have to examine large amounts of data, which makes the human process very inefficient.

What is needed, therefore, is a system that tends to reduce issues such as those described above, at least in part.

SUMMARY OF THE INVENTION

These and other needs are met by a method of detecting starting positions, sizes, and number of records of fields within a bit stream, by formatting the bit stream into a frame using positive logic, then performing decimal conversion of different predetermined field lengths on the framed bit stream, to produce channels. Noise is either removed or amplified from the framed bit stream, and the frame and the channels are input to an image detection module to identify fields within the framed bit stream.

In various embodiments according to this aspect of the invention, a manual input of a starting bit and a frame size of the bit stream is used to format the bit stream into a framed bit stream. In some embodiments, an automatic input of a frame size is made by estimating a frame size using autocorrelation of the bit stream into a framed bit stream. In some embodiments, a frame size is estimated based on Fourier transform to determine a periodicity of data in the bit stream to format the bit stream into a framed bit stream.

In some embodiments, the decimal conversion is accomplished by converting binary integers of the positive frame into decimal integers by applying a sliding window of size M, converting M bits into a decimal integer using a predefined conversion method, entering the decimal integer into an array at row r and column c, where r and c represent a position of a first bit of the sliding window in the positive frame, repeating for every bit in the positive frame to complete a given array, repeating for every desired sliding window size M, to produce a different array for each sliding window size M, and appending the arrays as channels to the framed bit stream.

In some embodiments, negative Boolean logic is applied to the framed bit stream to produce a negative framed bit stream and capture features independently of which binary symbol is used to represent background color in the image detection module.

In some embodiments, the step of removing or amplifying noise is accomplished by merging the positive frame and the negative frame, and applying low pass filters to remove the noise in the channels using an M filter network, where M is a number of hypothetical field lengths, and each filter operates in a given channel to extract features unique to a field of M bits, and multiple network layers are used.

According to another aspect of the invention there is described a bit stream filter for decoding a digital broadcast. An antenna intercepts the digital broadcast, and a receiver converts the digital broadcast into a digital linear bit stream. A storage device stores the digital linear bit stream, and a memory device holds programming instructions and portions of the digital linear bit stream as they are processed. A user interface receives the programming instructions and providing output, and a processor performs the programming instructions on the portions of the digital linear bit stream held in the memory device. A formatting module reformats the digital linear bit stream into a frame, and a decoding module extracts features of dynamic numerical fields within the frame. A noise processing module removes noise from sequential fields within the frame, and an image detection module receives the frame and the features and classifies standard images within the appended frame.

In some embodiments according to this aspect of the invention, the user input receives a manual input of a starting bit and a frame size of the bit stream to format the bit stream into the frame. In some embodiments, the processor provides an automatic input of a frame size by estimating a frame width using autocorrelation of the bit stream to format the bit stream into a frame. In some embodiments, the processor estimates a frame size based Fourier transform to compute a periodicity of data in the bit stream to format the bit stream into a framed bit stream.

In some embodiments, the decoding module (a) applies a sliding window of size M, converting M bits into a decimal integer using a predefined conversion method, (b) enters the decimal integer into an array at row r and column c, where r and c represent a position of a first bit of the sliding window in the frame, (c) repeats (a) and (b) for every bit in the frame to complete a given array, (d) repeats (a), (b), and (c) for every desired sliding window size M, to produce a different array for each sliding window size M, and € appends the arrays as channels to the frame.

In some embodiments, the formatting module copies the frame to produce a copy of the frame, applies negative Boolean logic to the copy of the frame, and appends the copy of the frame to the frame.

In some embodiments, the noise processing module merges the frame and the negative framed bit stream, and applies filters to remove or amplify the noise in the channels using an M filter network, where M is a number of hypothetical field lengths, and each filter operates in a given channel to extract features unique to a field of M bits, and multiple network layers are used.

According to another aspect of the invention there is described a bit stream filter for decoding a digital broadcast. An antenna intercepts the digital broadcast, and a receiver converts the digital broadcast into a digital linear bit stream. A storage device stores the digital linear bit stream, and a memory device holds programming instructions and portions of the digital linear bit stream as they are processed. A user interface receives the programming instructions and provides an output, and a processor performs the programming instructions on the portions of the digital linear bit stream held in the memory device. A formatting module reformats the digital linear bit stream into a frame, copies the frame to produce a copy of the frame, applies negative Boolean logic to the copy of the frame, and appends the copy of the frame to the frame to produce an appended frame. A decoding module extracts features of dynamic numerical fields within the appended frame, and a noise processing module removes or amplifies noise from sequential fields within the appended frame. An image detection module receives the appended frame and the features and classifies standard images within the appended frame.

In some embodiments according to this aspect of the invention, the user input receives a manual input of a starting bit and a frame size of the bit stream to format the bit stream into the framed bit stream. In some embodiments, the processor provides an automatic input of a frame size by estimating a frame width using autocorrelation of the bit stream to format the bit stream into a framed bit stream. In some embodiments, the processor estimates a frame size based on Fourier transforms to determine a periodicity of data in the bit stream to format the bit stream into a framed bit stream.

In some embodiments, the decoding module (a) applies a sliding window of size M, converting M bits into a decimal integer using a predefined conversion method, (b) enters the decimal integer into an array at row r and column c, where r and c represent a position of a first bit of the sliding window in the frame, (c) repeats (a) and (b) for every bit in the frame to complete a given array, (d) repeats (a), (b), and (c) for every desired sliding window size M to produce a different array for each sliding window size M, and (e) appends the arrays as channels to the frame.

In some embodiments, the noise processing module applies filters to remove or amplify the noise in the channels using an M filter network, where M is a number of hypothetical field lengths, and each filter operates in a given channel to extract features unique to a field of M bits, and multiple network layers are used.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 10 depicts the decimal decoding of a three-bit field according to an embodiment of the present invention.

DETAILED DESCRIPTION OF THE INVENTION

OVERVIEW

Various embodiments of the present invention can perform data mining of framed bit streams with unlabeled fields. In particular, some embodiments focus on the detection and classification of numerical fields from dynamically sampled processes that do not exhibit a random behavior. These seek to transform a bit stream into arrays of features that can be fed into a machine-learning image classifier/detector for data mining purposes. Without this process, a machine learning image detection module, such as a convolutional neural network, would average the bits of the original bit stream and destroy the information needed for identifying the fields.

One novel aspect of the present invention is the preparation of a framed bit stream that is then input to an image detection routine. In the past, image detection has not been used to interpret non-image data. However, according to various embodiments of the present invention, an image detection routine is useful to detect the location and size of non-image data fields. This is accomplished by framing the bit stream (formatting it as a two-dimensional array), and using it and data produced by various analyses of the framed bit stream as input to the image detection routine.

To extract the features of the fields in the original data stream, the bits are decoded under the assumption that the field size is known. A set of field lengths is used to form arrays of features referred as channels. In each channel, a correct decoding preserves the sensor data fields. However, an incorrect decoding generates noise. Also, any existing noise surrounding the data fields is transformed as more noise by the decoding process. Thus, the decoding process is employed as a feature generation algorithm for discriminating between noise and sensor data and estimating the proper field size.

A network of filters is applied to the channels with the purpose of removing or amplifying the noise without changing the features of the sensor fields. The filtered channels are fed into an image detector and treated like the red-green-blue (RGB) channels of a standard image. Thus, as a part of one embodiment of the present invention, the output of the image detection module is utilized for data mining purposes, providing field lengths and field location information. Of course, the use of an image detection method to harvest numerical data is a unique application of the image detection method.

Figure 1:
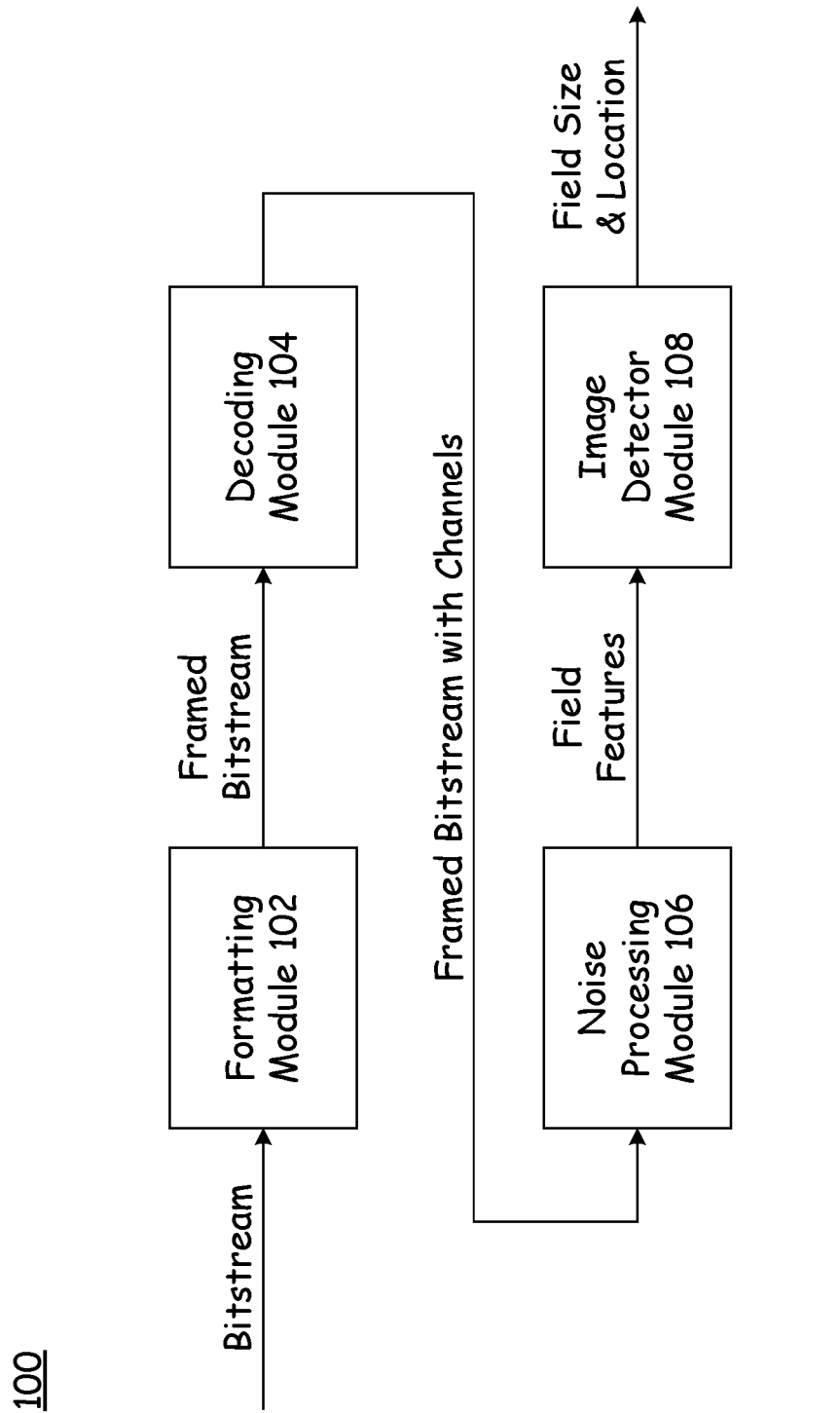
FIG. 1 is a simplified flow chart for a method according to an embodiment of the present invention.

With reference to FIG. 1, a basic embodiment of such a system includes a formatting module 102 that formats a bit stream into a framed bit stream by inputting an actual or estimated frame size, a decoding module 104 that decodes the framed bit stream into arrays (also called channels herein) of decimal integers by assuming a selection of hypothetical field lengths, a noise processing module 106 that implements a network of filters that process each column of the channels and determines whether the columns contain noisy or smooth sequences, and feeding the filtered output to an image detection module 108 for detection and classification of the fields in the framed bit stream.

Additional embodiments include (5) using positive and negative Boolean logic in the original bit stream to facilitate the detection, regardless of which symbol is interpreted as the background "color" (1's or 0's) by the image detection module.

In the decoding module 104, multiple channels of the original frame are created. Each channel is constructed by selecting a different hypothetical field length and decoding the bits in the frame assuming either little endian or big endian information and one's or two's complement. Each element of a channel so produced contains the value of a record of a field starting at a given row and column of the array. The channel is zero-padded for any bit of the field that exceeds the dimensions of the frame. These channels are the first step in constructing detection features for the fields.

In the noise processing module 106, filtering is applied to each channel that has been produced by using filters that operate on records to capture the dynamics of the field variations over time. The applied filters are implemented in the form of column vectors and applied to all the channels. Their goal is to preserve the smooth sequences generated by sensor data and altering the noise content by either removing or amplifying it, depending upon the original level of the noise. These filters may be implemented by using derivatives, low pass filter, high pass filter, or a combination of these. The filtered output is a set of arrays that contain the detection features of fields of the different hypothetical field lengths that have been assumed and processed. During the classification process, a field that does not fit any of the assumed sizes may be interpreted as a field with the closest field length.

The extracted features are fed into a machine learning image detection module 108 that is used to detect numerical fields. The extracted features are arranged as channels. These channels are treated as red-green-blue (RGB) channels of a standard image, with the exception that they are not limited to three channels. The output of the image detection module 108 is information in regard to the fields, including field length, initial position of the record in the frame, and ending position of the record in the frame.

In some embodiments the linear bit stream is formatted into a frame in the formatting module 102 by supplying to the engine either the actual frame size or an estimate of the frame size. If the frame size is unknown, the size can be estimated using Fourier Transform methods to find the periodicity of the frame. The Fourier spectrum of a periodic structure like framed data contains peaks that are associated with the inverse of the frequency, which in this case corresponds to the frame size or a multiple of this value. A rudimentary frame-size estimator frames the data over potential values of the frame size.

In some embodiments, the formatting module 102 appends a Boolean negated version of the original bit stream frame, which negated version helps with the detection when negative logic is used to represent bits. This is similar to the problem of establishing the background color in black and white images. The use of negated Boolean symbols allows the system to treat zeroes as ones, and vice versa. This embodiment assumes that the unintended receiver does not know the convention used for representing the Boolean data in the intercepted stream. The negated data can be processed in parallel to the original data. The Boolean transform does not affect the field length or other features of the field. Parallel processing in one embodiment is implemented by appending the negated Boolean frame to the columns of the original frame.

Figure 2:
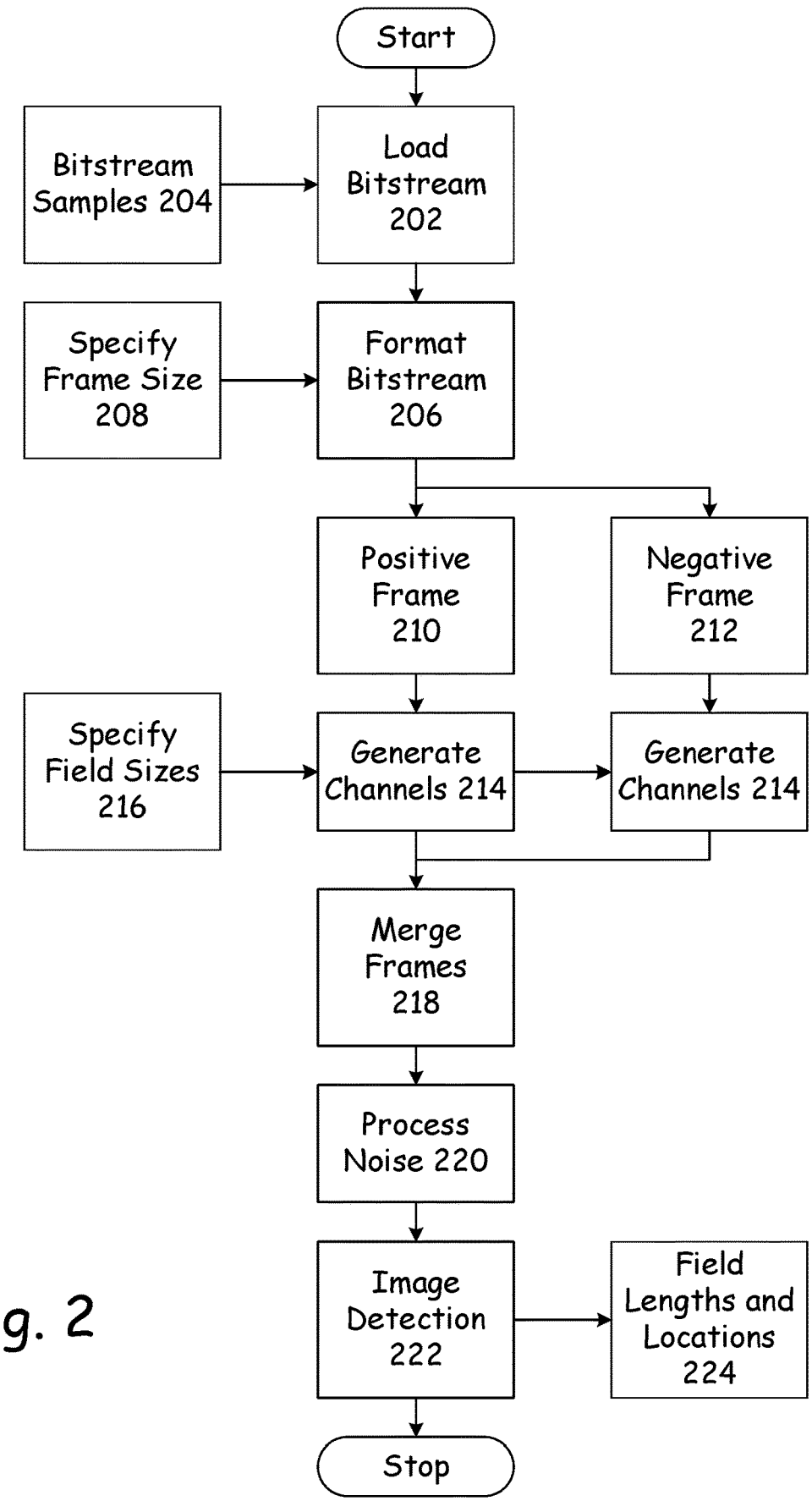
FIG. 2 is a detailed flow chart for a method according to an embodiment of the present invention.

FIG. 2 depicts a more detailed flow chart for the overall method 200. As depicted, bit stream samples are acquired, as given in block 204, and loaded into the processing system, as given in block 202. A frame size is specified as given in block 208. This specified frame size can either be an educated guess, or the size of prior frames that have worked well, or a computed frame size. The bit stream is then formatted with the specified frame size, as given in block 206.

Figure 5:
FIG. 5 is a graphical depiction of a positive-logic framed bit stream according to an embodiment of the present invention.

The original framed bit stream is designated a positive-logic frame, as given in block 210, for the purposes of discussion herein. With reference now to FIG. 5, there is depicted a portion of a bit stream that has been reformatted as a framed bit stream. By properly selecting the position in the bit stream that is the starting point in the frame, and the frame length, the resulting array reveals distinctive patterns that correspond to sequential fields. For the present purposes of discussion, ones in the bit stream are represented by black blocks 502 and zeroes in the bit stream are represented by white blocks 504. Of course, use of color or white/black to represent binary data is purely representational, and could be different in various embodiments or depictions.

Figure 6:
FIG. 6 is a graphical depiction of a negative-logic framed bit stream of FIG. 5 according to an embodiment of the present invention.

An inverse transform of the original frame is created, as given in block 212, which is designated a negative-logic frame for the purposes of discussion herein. FIG. 6 depicts the effect of applying a Boolean negated logic to the framed bit stream of FIG. 5, to produce a negative image 600. This transform takes the inverse of each bit in the frame (swapping the black and white, in effect), and turning the zeroes into ones and the ones into zeros. In this transformation, the distinctive patterns of the fields are preserved. The machine learning algorithms described herein are able to detect the field patterns regardless of the color assignment, also referred as the background color herein.

Various field lengths are input to the system, as given in block 216. These field lengths can be estimates or guesses at the field lengths that might actually exist within the frames, or the actual field lengths might be known. For example, field lengths of lengths from two to twenty bits might be input. These various field lengths are input into processing modules to generate channels for both the positive frame and the negative frame, as given in blocks 214.

FIG. 10 depicts the generation of a channel that is used for detecting a three-bit field, for example. Of course, a three-bit field might not exist within the data frame, but since the interceptor of the bit stream does not know this, the data frame is tested for a variety of different field lengths. As the number of different field-sizes that are investigated is increased, so too does the probability increase that all of the fields in the data frame will be found.

For the example of investigating a three-bit field, a sliding three-bit window scans across the frame while tracking the position of its first bit. The window assumes a predetermined binary integer format. In this case, the binary integer format is a two's complement and little-endian. Other formatting possibilities include a one's complement or big-endian. Other window sizes are also investigated, as described. The output for this channel is as depicted in the decimal array of FIG. 10.

More specifically, each selected field length is used to convert binary integers into decimal integers using the following steps. A sliding window of size M (the selected field size) takes M bits and converts then into a base-10 integer using the predefined format (two's complement, for example). The decimal number is entered into a new two-dimensional array at row r and column c, where r and c represent the position of the first bit in the sliding window in the frame. If the sliding window exceeds the dimensions of the frame, the bit positions outside of the frame are filled with zeros in the case of a positive logic, or filled with ones in the case of negative logic. The operation is repeated (1) for every bit in the frame, (2) for every hypothetical frame size, and (3) for both the positive and negative frames 500 and 600. The resulting arrays are designated as channels and appended to their respective frame. These channels are treated in a similar manner to a red-green-blue channel of a standard image.

Figure 7:
FIG. 7. is a graphical depiction of an appended positive and negative framed bit stream according to an embodiment of the present invention.

After the channels are produced, the positive and negative frames 500 and 600, with their channels, are merged together, as given in block 218. FIG. 7 depicts the result of merging the original or positive data frame 500 of FIG. 5 with the negative transform 600 of FIG. 6, producing the merged frame 700. Appending these fields allows parallel processing of both images (positive and negative, so to speak) at the same time, and reinforces the learning process of the machine learning stage. Parallel processing can also be implemented by treating the negative Boolean logic as a separate image.

Figure 8:
FIG. 8 is a graphical depiction of noise in a framed bit stream according to an embodiment of the present invention.

The noise is removed from the merged frames, as given in block 220. FIG. 8 depicts a frame 800 that contains noisy data. As depicted, the noise tends to reduce the clarity of the fields identified in FIG. 5, but at the level of noise depicted does not entirely obfuscate the data fields. The noisy data presents as irregular patterns, but none of it represents a sequential field. Decoding such fields produces random sequences of numbers.

The noise processing stage removes or amplifies the noise for creating a contrast between smooth sequences and noise. The noise can be either removed with low pass filters or amplified with high pass or derivatives. The goal of the stage is to provide more discriminating features to the classifier.

Finally, the merged and cleaned-up frames are input to an image detection module, as given in block 222, which produces as output a variety of detected field lengths and their respective locations, as given in block 224.

Figure 3:
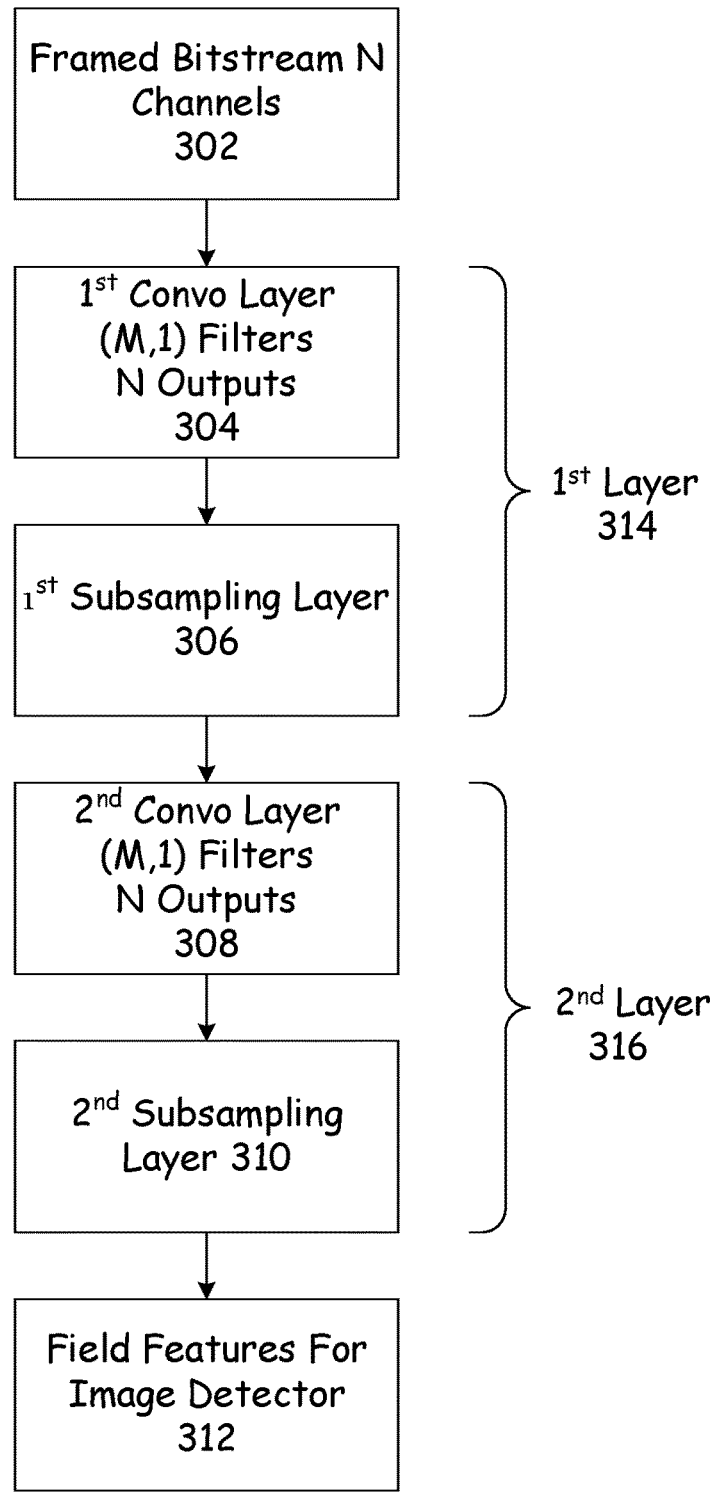
FIG. 3 is a detailed flow chart for a portion of a method according to an embodiment of the present invention.

FIG. 3 depicts a functional block diagram of a neural network 300 that uses two layers 314 and 316 of column-wise filters for extracting the correlation among the different records of the framed bit stream. Column-wise filters allow averaging of the values of the sequences as they change from record to record. At the same time, the column-wise filters ignore correlations of adjacent fields, which can be assumed to be independent. Filters that are applied to as many as three columns are used in some embodiments. Applying a filter to more columns than this tends to cause mixing between the fields, which results in the destruction of information.

The first layer 314 takes the framed bit stream and its N channels (for a total of N+1 inputs) and produces N outputs. The first layer 314 filters noise while preserving the features of the fields. The N outputs are subsampled and feed into a second layer 316 that takes N inputs and produces N outputs. The selection of N filters reinforces that the output will have N distinct features, one for each field size that is being investigated.

In a different embodiment, a multiple of N filters is employed in the first layer 314, and the outputs are subsampled. The second layer 316 reinforces the rejection of noise and the preservation of features. Additional layers can be added, following a similar pattern. The overall output is fed in to the image detection module 312. These arrays are connected to the image detection module 312, which treats them as though they are RGB channels of a standard image.

FIG. 3 is as a convolutional neural network with fixed weights. The purpose of this network is to facilitate the feature extraction. The first layer 314 of the network is a convolutional filter and is responsible for extracting one feature per possible field. The second layer 316 reinforces the feature extraction of the first layer. The features increase the contrast between noise and smooth fields. Various possibilities exists for the selection of the weights. The weights can also be selected by implementing the network as part of the image detector algorithm.

Figure 4:
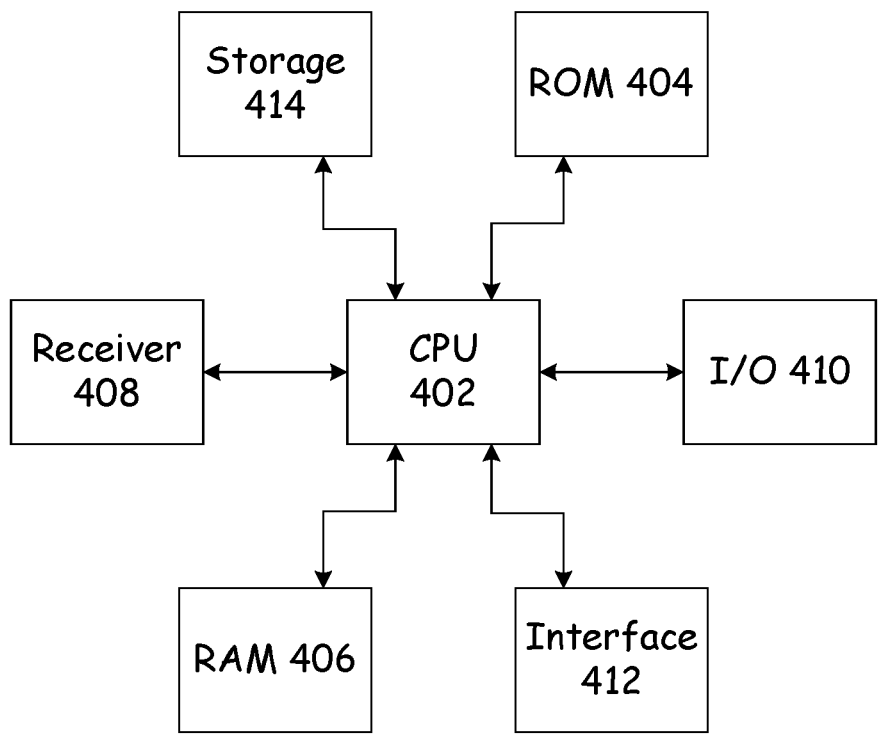
FIG. 4 is a functional block diagram of an apparatus according to an embodiment of the present invention.

FIG. 4 depicts the hardware on which the various computing modules as describe herein can be implemented in one embodiment. As used herein, the term "module" refers to a combination of both hardware and software that is used to accomplish a specific function. In some embodiments, modules share hardware between one another, or in other words run on the same hardware, and in some embodiments even share portions of software between one another. Modules are predominantly defined by the function that they perform.

As depicted in FIG. 4, the computing device 400 has a central processor or CPU 402. A read only memory 404 holds programming instructions for the operation of the device 400, such as the specialized programming that is used for each of the different modules that are described herein, and for the basic operating instructions of the device 400. A random access memory 406 holds programming instructions as they are currently run, data that is currently being operated on, data that is generated, and other relatively volatile data. The receiver 408, such as a radio frequency receiver, receives the bit stream as it is broadcast. In some embodiments the bit stream is received live for processing. The input/output module 410 allows data to be communicated from and to the device 400. In some embodiments the bit stream is received from a remote storage through the IO 410 for processing. An interface 412, such as a keyboard and display, is used to communicate commands to and receive output from the device 400. A storage 414, such as a hard drive or optical device, is used for longer-term storage of the bit stream or the results produced by the various modules as described herein. In some embodiments the bit stream is recorded to and then received from the storage 414 for processing.

Figure 9:
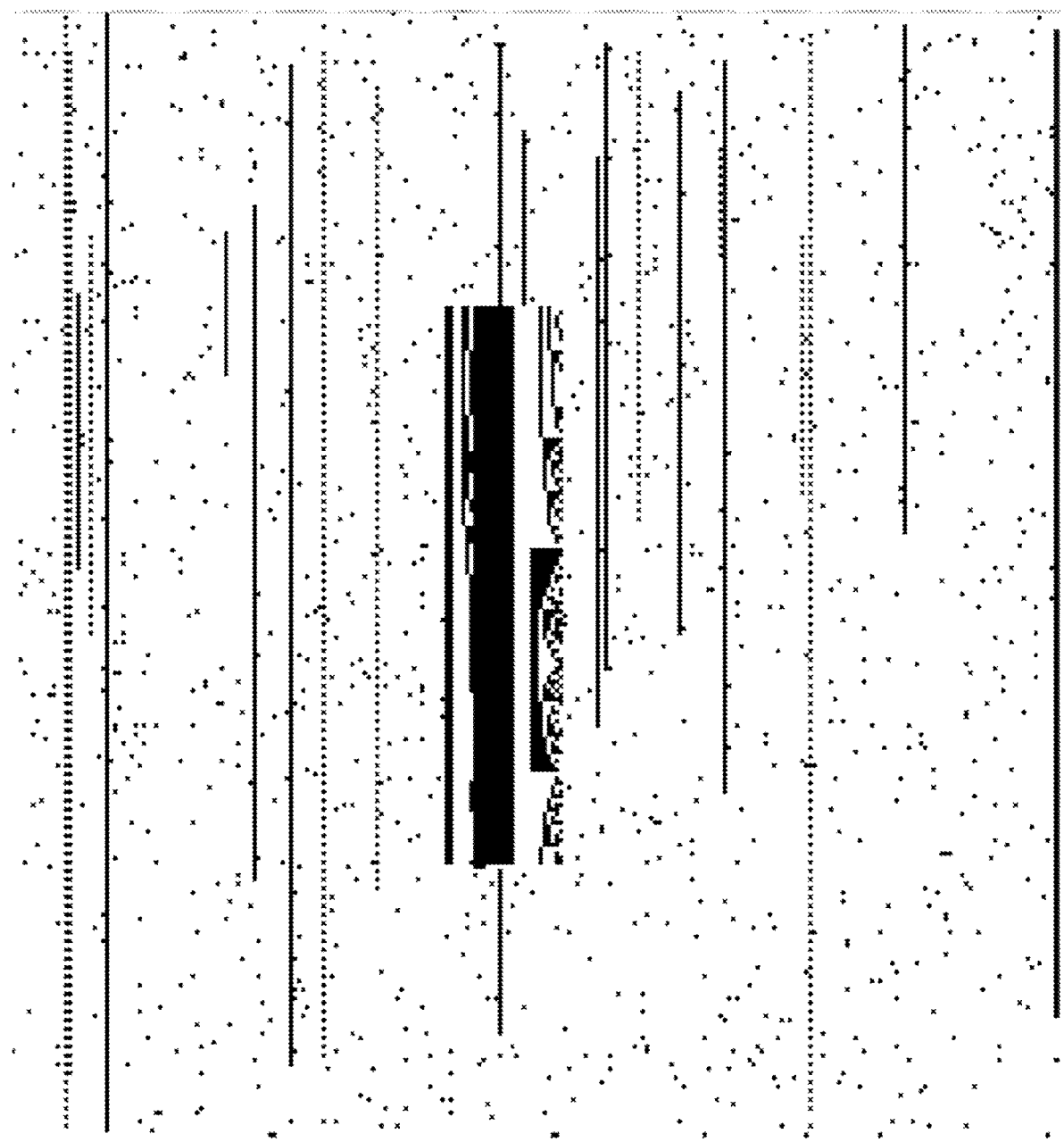
FIG. 9 is a graphical depiction of data within noise according to an embodiment of the present invention.

FIG. 9 depicts a different view of a data frame 900 with sequential field data in background noise. The dynamic nature of the fields makes an image detection approach unsuitable to identify the field patterns shown at the center of the figure. Various embodiments of the present invention are able to identify sequential fields within the noise. The most important ones are: decoding the fields, creating a contrast between the background or decoder noise and the smooth sequences, and training an image detector with a known dataset so the classifier is able to discriminate between the noise and fields. Finally, the identification is made possible by drawing the fields in the pictorial representation of the array.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

REFERENCE NUMBER INDEX

100 High level overview of method
102-108 Steps of method 100
200 Detailed method
202-224 Steps of detailed method
300 Further detail of method
302-312 Steps of further detail of method
400 Apparatus
402-414 Elements of apparatus
500 Input frame
502 Logical high pixel depictions
504 Logical low pixel depictions
600 Negative frame
602 Logical low pixel depictions
604 Logical high pixel depictions
700 Merged input and negative frames
800 Input frame with noise
900 Data frame in noise

What is claimed is:

1. A method of detecting starting positions, sizes and number of records of fields within a bit stream, the method comprising the steps of:
   formatting the bit stream into a frame using positive logic,
   performing decimal conversion of different predetermined field lengths on the framed bit stream, to produce channels,
   removing or amplifying noise from the framed bit stream, and
   inputting the frame and the channels to an image detection module to identify fields within the framed bit stream;
   wherein the method further comprises the steps of:
   manually inputting a starting bit and a frame size of the bit stream to format the bit stream into a framed bit stream;
   automatically inputting a frame size by estimating a frame size using autocorrelation of the bit stream into a framed bit stream;
   estimating a frame size based on Fourier transform to determine a periodicity of data in the bit stream to format the bit stream into a framed bit stream; and
   wherein the decimal conversion is accomplished by converting binary integers of the positive frame into decimal integers by:
   applying a sliding window of size M, converting M bits into a decimal integer using a predefined conversion method,
   entering the decimal integer into an array at row r and column c, where r and c represent a position of a first bit of the sliding window in the positive frame,
   repeating for every bit in the positive frame to complete a given array,
   repeating for every desired sliding window size M, to produce a different array for each sliding window size M, and
   appending the arrays as channels to the framed bit stream.

2. The method of claim 1, further comprising applying negative Boolean logic to the framed bit stream to produce a negative framed bit stream and capture features independently of which binary symbol is used to represent background color in the image detection module.

3. The method of claim 2, wherein the step of removing or amplifying noise is accomplished by:
   merging the positive frame and the negative frame, and
   applying low pass filters to remove the noise in the channels using an M filter network, where M is a number of hypothetical field lengths, and each filter operates in a given channel to extract features unique to a field of M bits, and multiple network layers are used.

4. A bit stream filter for decoding a digital broadcast, the bit stream filter comprising:
   an antenna for intercepting the digital broadcast,
   a receiver for converting the digital broadcast into a digital linear bit stream,
   a storage device for storing the digital linear bit stream,
   a memory device for holding programming instructions and portions of the digital linear bit stream as they are processed,
   a user interface for receiving the programming instructions and providing output,
   a processor for performing the programming instructions on the portions of the digital linear bit stream held in the memory device,
   a formatting module for reformatting the digital linear bit stream into a frame,
   a decoding module for extracting features of dynamic numerical fields within the frame,
   a noise processing module for removing noise from sequential fields within the frame, and
   an image detection module for receiving the frame and the features and for classifying standard images within the appended frame;
   wherein the user input receives a manual input of a starting bit and a frame size of the bit stream to format the bit stream into the frame;
   wherein the processor provides an automatic input of a frame size by estimating a frame width using autocorrelation of the bit stream to format the bit stream into a frame;

wherein the processor estimates a frame size based Fourier transform to compute a periodicity of data in the bit stream to format the bit stream into a framed bit stream; and wherein the decoding module:
(a) applies a sliding window of size M, converting M bits into a decimal integer using a predefined conversion method,
(b) enters the decimal integer into an array at row r and column c, where r and c represent a position of a first bit of the sliding window in the frame,
(c) repeats (a) and (b) for every bit in the frame to complete a given array,
(d) repeats (a), (b), and (c) for every desired sliding window size M, to produce a different array for each sliding window size M, and
(e) appends the arrays as channels to the frame.

5. The bit stream filter of claim 4, wherein the formatting module:
copies the frame to produce a copy of the frame,
applies negative Boolean logic to the copy of the frame, and
appends the copy of the frame to the frame.

6. The bit stream filter of claim 5, wherein the noise processing module:
merges the frame and the negative framed bit stream, and
applies filters to remove or amplify the noise in the channels using an M filter network, where M is a number of hypothetical field lengths, and each filter operates in a given channel to extract features unique to a field of M bits, and multiple network layers are used.

7. A bit stream filter for decoding a digital broadcast, the bit stream filter comprising:
an antenna for intercepting the digital broadcast,
a receiver for converting the digital broadcast into a digital linear bit stream,
a storage device for storing the digital linear bit stream,
a memory device for holding programming instructions and portions of the digital linear bit stream as they are processed,
a user interface for receiving the programming instructions and providing output,
a processor for performing the programming instructions on the portions of the digital linear bit stream held in the memory device,
a formatting module for,
reformatting the digital linear bit stream into a frame,
copying the frame to produce a copy of the frame,
applying negative Boolean logic to the copy of the frame, and
appending the copy of the frame to the frame to produce an appended frame,
a decoding module for extracting features of dynamic numerical fields within the appended frame,
a noise processing module for removing or amplifying noise from sequential fields within the appended frame, and
an image detection module for receiving the appended frame and the features and for classifying standard images within the appended frame.

8. The bit stream filter of claim 7, wherein the user input receives a manual input of a starting bit and a frame size of the bit stream to format the bit stream into the framed bit stream.

9. The bit stream filter of claim 7, wherein the processor provides an automatic input of a frame size by estimating a frame width using autocorrelation of the bit stream to format the bit stream into a framed bit stream.

10. The bit stream filter of claim 7, wherein the processor estimates a frame size based on Fourier transforms to determine a periodicity of data in the bit stream to format the bit stream into a framed bit stream.

11. The bit stream filter of claim 7, wherein the decoding module:
(a) applies a sliding window of size M, converting M bits into a decimal integer using a predefined conversion method,
(b) enters the decimal integer into an array at row r and column c, where r and c represent a position of a first bit of the sliding window in the frame,
(c) repeats (a) and (b) for every bit in the frame to complete a given array,
(d) repeats (a), (b), and (c) for every desired sliding window size M, to produce a different array for each sliding window size M, and
(e) appends the arrays as channels to the frame.

12. The bit stream filter of claim 7, wherein the noise processing module applies filters to remove or amplify the noise in the channels using an M filter network, where M is a number of hypothetical field lengths, and each filter operates in a given channel to extract features unique to a field of M bits, and multiple network layers are used.

* * * * *